United States Patent [19]

Uehara et al.

[11] Patent Number: 4,795,244

[45] Date of Patent: Jan. 3, 1989

[54] PROJECTION TYPE EXPOSURE APPARATUS

[75] Inventors: Makoto Uehara, Tokyo; Koichi Matsumoto, Kita; Yutaka Suenaga, Kawasaki; Kiyoyuki Muramatsu, Yokohama, all of Japan

[73] Assignee: Nikon Corporation, Tokyo, Japan

[21] Appl. No.: 906,986

[22] Filed: Sep. 15, 1986

[30] Foreign Application Priority Data

Sep. 20, 1985 [JP] Japan .............................. 60-208396
Mar. 17, 1986 [JP] Japan .............................. 61-58624

[51] Int. Cl.⁴ .......................................... G01B 11/00
[52] U.S. Cl. ................................. 356/401; 250/548
[58] Field of Search ................. 356/401, 400, 150; 250/548, 491.1

[56] References Cited

U.S. PATENT DOCUMENTS

| | | | |
|---|---|---|---|
| 4,422,703 | 12/1983 | Kleinknecht | 356/356 |
| 4,498,762 | 2/1985 | Uehara et al. | 355/55 |
| 4,616,130 | 10/1986 | Omuta | 250/201 |
| 4,685,807 | 8/1987 | Picard | 356/401 |

Primary Examiner—Bruce C. Anderson
Assistant Examiner—Paul A. Guss
Attorney, Agent, or Firm—Shapiro and Shapiro

[57] ABSTRACT

A projection type exposure apparatus for projecting an image of a pattern formed on a reticle onto a wafer in which the exposure is carried out with first light and the alignment between reticle and wafer is carried out with a second light having a wavelength different from that of the first light. The apparatus includes an optical member disposed between alignment optical system and projection optical system for reflecting the first light and transmitting the second light.

19 Claims, 5 Drawing Sheets

F I G. 7
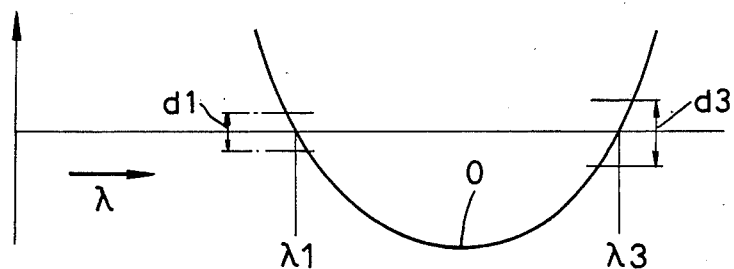
F I G. 8
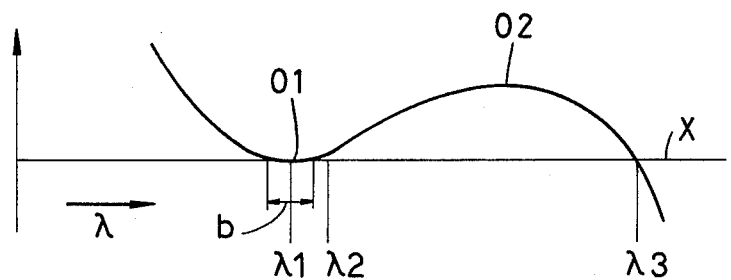

PROJECTION TYPE EXPOSURE APPARATUS

BACKGROUND OF THE INVENTION

1. Field of the Invention

The present invention relates to a projection type exposure apparatus for use in manufacture of semiconductor devices.

2. Related Background Art

The manufacturing method of semiconductor devices generally includes a lithography process in which a wafer is subject to a repeating cycle of resist coating-alignment-exposure-chemical treatment. With the tremendous increase of the degree of integration of semiconductor devices in recent years, a reducing projection type exposure apparatus has been introduced for carrying out the steps of alignment and exposure in the lithography process. The apparatus has now been widely used for this purpose.

The reducing projection type exposure apparatus is required to have a projection lens of high resolving power. Through the high resolution projection lens, an image of a pattern on a reticle is projected onto a wafer. The reticle is a photo mask composed of a light-transmissive part and a light-blocking part. The wafer has a size of about 75 mm to 150 mm in diameter and is placed on a moving stage. The pattern image is projected in a square exposure field of 10 mm×10 mm to 20 mm×20 mm on the wafer. Since the stage-shift and the exposure are repeated a number of times for one and same wafer, the alignment, exposure and stage-shift must be carried out rapidly. At the same time, it is essential to attain the alignment at a high degree of accuracy corresponding to the high resolving power of the projection lens.

For the alignment step using the reducing projection type exposure apparatus, the alignment is carried out according to the so-called die-by-die alignment method. According to the alignment method, at every exposure of a pattern image through the projection lens, an image of an alignment mark is also projected on the wafer so that by the chemical treatment after exposure an alignment mark may be formed.

For the next exposure, this alignment mark on the wafer is aligned with an alignment on the next reticle. This alignment is carried out every time after exposure.

Since the alignment mark on the reticle is aligned with the alignment mark on the wafer through an aberration-compensated projection optical system, it is desirable that the operator can check the state of the alignment also during the printing exposure. However, in case of the known TTL alignment optical system for alignment through a projection lens, the check of the alignment is impossible during the exposure. This is because a part of the alignment optical system is disposed in the light path for exposure and at the time of exposure the part is retracted to a position out of the exposure light path. In addition, the known alignment optical system has a very complicated construction.

A further problem is caused by the illumination light used to illuminate the alignment marks in the prior art apparatus. In many of the above-mentioned prior art apparatus, to illuminate both the alignment marks on the reticle and on the wafer there has been used illumination light of a wavelength which is near the wavelength region of the light for exposure. This fact has produced an unfavorable effect on the relation between the layer of resist (photosensitizing agent) coated on the wafer and the light for alignment.

The ordinary resist is photo-sensitive to a wide range of wavelengths including the wavelength near the exposure wavelength. Therefore, when the wavelength used for alignment is near the wavelength for exposure, the resist on the alignment mark is unfavourably subjected to photochemical change by the exposure light at the time of exposure. Because of this, reprinting of the alignment mark is needed at every time after the exposure step. This is not only troublesome but also a cause for the decreasing of the alignment accuracy. Furthermore, the alignment detection signal is rendered unstable. Since the alignment mark on the wafer is observed through the resist layer, the qualitative change of the resist by the exposure light produces a change in state of observation (mainly contrast of alignment mark). The state of observation after the exposure is no longer the same as that before the exposure, which renders the alignment detection signal unstable.

To solve the problem, a multi-layer resist and a dye-containing resist CED (Contrast Enhanced Litography) have already been proposed. The multi-layer resist is a resist so formed that under the condition of interference to the exposure wavelength it is non-reflective. The dye-containing resist CEL uses a sensitizer having a light-absorbing layer. These particular resists also have a disadvantage that the alignment mark on the wafer is hardly observed with the alignment wavelength near that of exposure.

SUMMARY OF THE INVENTION

Accordingly, it is a general object of the present invention to overcome the drawbacks of the prior art apparatus as described above.

More specifically, it is an object of the invention to provide a projection type exposure apparatus in which the detection of an alignment mark can be improved without any adverse effect caused by the resist layer on the wafer.

It is another object of the invention to provide a projection type exposure apparatus which enables production of semiconductor devices with precision and high through-put.

In order to attain the above objects, the apparatus according to the present invention comprises a projection optical system for projecting an image of a pattern on a reticle onto a wafer; an illumination optical system for illuminating the pattern on the reticle by light of a first wavelength; an alignment optical system for detecting the alignment between reticle and wafer through the projection optical system by light of a second wavelength different from the first one; and an optical member which is able to reflect one of the first and second wavelengths and transmit the other and through which the illumination of the reticle and the detection of the alignment are carried out.

Other and further objects, features and advantages of the present invention will appear more fully from the following description taken in connection with the accompanying drawings.

BRIEF DESCRIPTION OF THE DRAWINGS

FIGS. 6 to 8 are graphs illustrating the optical properties of the projection lenses as shown in FIGS. 3 and 4.

DESCRIPTION OF THE PREFERRED EMBODIMENTS

Figure 1:
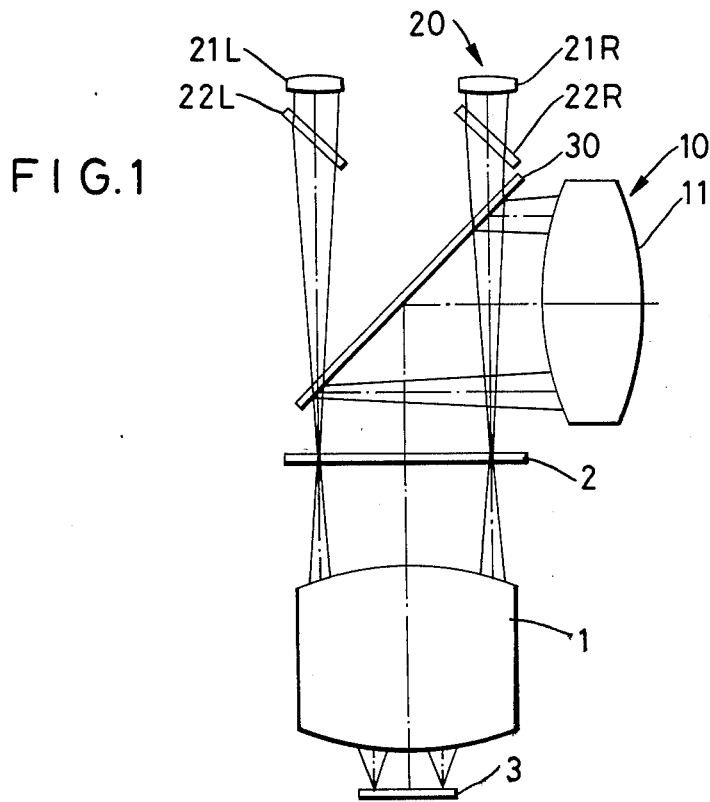
FIG. 1 is a schematic view of an optical system showing a first embodiment of the present invention.

Referring to FIG. 1, the projection type exposure apparatus is generally composed of an exposure illumination optical system 10, an alignment optical system 20 and a dichroic mirror 30.

The exposure illumination optical system 10 includes a projection objective lens 1 through which a pattern on a reticle 2 is projected onto a wafer 3 to print an image of the pattern on the wafer by a first wavelength light (light having wavelength $\lambda 1$). The alignment optical system 20 is used to align the wafer 3 with the reticle through the projection lens 1 by a second wavelength light (light having wavelength $\lambda 2$). The wavelength $\lambda 2$ is longer than $\lambda 1$.

The dichroic mirror 30 is a wavelength-separation reflective optical member which reflects the first wavelength light but transmits the second wavelength light. Although not shown, the reticle 2 is supported by a reticle holder and the wafer 3 is on a stage.

The dichroic mirror 30 is a plane parallel plate having a certain desired thin film formed thereon. The mirror is disposed 45° inclined to the optical axis of the projection lens 1.

In the path of the reflected light from the dichroic mirror 30 there is a main condenser 11 of the exposure illumination optical system 10. In the path of the transmitted light through the dichroic mirror there are members 21L, 21R and 22L and 22R of the alignment optical system 20. The members 21L and 21R are objective lenses. 22L and 22R are plane parallel plates for correcting coma.

The dichroic mirror 30 is mounted across the two convergent beams formed by the objective lenses 21L and 21R.

The plane parallel plates 22L and 22R are so formed as to have refractive index and thickness effective for the correction of coma produced by the dichroic mirror 30. The plane parallel plates 22L and 22R are disposed inclined oppositely to the dichroic mirror 30, but with the same inclination angle (45°) as that of the mirror.

The projection objective lens 1 is a lens corrected for chromatic aberration to the first and second wavelength light.

Figure 2:
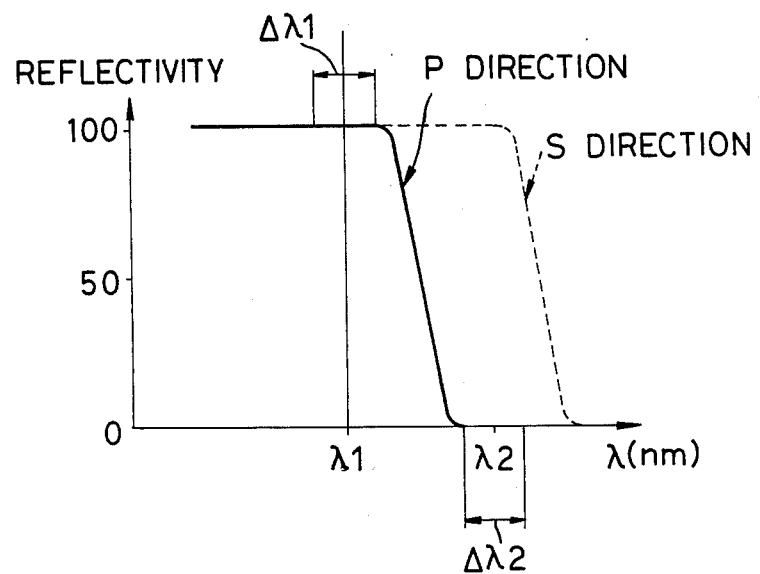
FIG. 2 is an optical characteristic curve of a dichroic mirror used in the first embodiment.

FIG. 2 illustrates the optical performance of the dichroic mirror 30.

As seen from FIG. 2, the thin film of the dichroic mirror 30 is so designed that it can reflect about 100% of the first wavelength light $\lambda_1$(nm) and transmit about 100% of the polarized component in P-direction of the second wavelength light $\lambda_2$(nm) while reflecting about 100% of the polarized component in S-direction of the second wavelength light. Herein, the P-direction is the direction orthogonal to the surface of the mirror 30 and the S-direction is the direction orthogonal to the P-direction.

Furthermore, it is required that the beam of a certain determined numerical aperture (NA) on the reticle side of the projection lens 1 should uniformly transmit through or reflect upon the dichroic mirror 30. Concretely speaking, since NA=0.1 corresponds to a wavelength shift of about ±3 nm in view of the thin film characteristics, the thin film of the dichroic mirror is designed in such manner that even light of a wavelength ±3 nm shifted from $\lambda_1$ may be reflected nearly 100% and the polarized component in P-direction of the light of such wavelength ±3 nm shifted from $\lambda_2$ may be transmitted also about 100%.

Projection lenses used in the reducing projection type exposure apparatus generally have a reduction factor ranging from 5 to 10. The numerical aperture (NA) on the wafer side is about 0.35. Consequently, on the reticle side, NA=0.07-0.035. For this reason, the dichroic mirror is required to exhibit uniform characteristics even to the light corresponding to NA=0.1.

In the characteristic curve of FIG. 2, the width $\Delta\lambda_1$ for the exposure light $\lambda_1$ and the width $\Delta\lambda_2$ for the alignment light $\lambda_2$ are the range of wavelength shift corresponding to NA=0.1. FIG. 2 shows that the optical characteristic of the dichroic mirror is stable even for such ranges.

Examples of the light useful as the first wavelength light are shown in the left column of the following table 1. As the light source there may be Hg lamp, excimer laser etc. Examples of the second wavelength light are shown in the right column of the table 1. As the light source there may be HeCd laser, dyestuff laser, Hg lamp etc. In accordance with the selected first and second wavelengths, the structure of the dichroic mirror 30 is determined so as to meet the characteristic curve as shown in FIG. 2.

TABLE 1

| First wavelength for exposure (light source) | Second wavelength for alignment (light source) |
|---|---|
| g-ray 436 nm (Hg lamp) | 422 nm (HeCd laser) |
| h-ray 404 nm (Hg lamp) | dyestuff laser |
| i-ray 365 nm (Hg lamp) | dyestuff laser |
| 313 nm (Hg lamp) | 325 (HeCd laser) |
| 308 nm (excimer laser) | dyestuff laser |
| 249 nm (excimer laser) | 254 nm (Hg lamp) |

The manner of operation of the first embodiment is as follows:

At first, the alignment between the reticle 2 and the wafer 3 is carried out through the projection objective lens 1. To this end, a second wavelength light is emitted from a light source (not shown) of the alignment optical system. The second wavelength light is transmitted to the dichroic mirror 30 through the objectives 21L, 21R and the plane parallel plates 22L, 22R. The dichroic mirror 30 transmits about 100% of the polarized component in P-direction of the second wavelength light.

The second wavelength light transmitted through the dichroic mirror 30 enters the reticle 2. Also, the light enters the wafer 3. The light reflected by the wafer 3 and the reticle 2 again enters the dichroic mirror 30 which again, transmits about 100% of the polarized component in P-direction of the second wavelength light. The second wavelength light thus transmitted through the dichroic mirror 30 comes back to the plane parallel plates 22L, 22R and to the objective lenses 21L and 21R. The operator observes the alignment marks on the reticle and the wafer through the alignment optical system 20 and brings the wafer and the reticle to alignment by moving them relatively. In this manner, the alignment step is completed.

As previously mentioned, in the prior art apparatus, a retraction of a part of the alignment optical system is needed after the completion of the alignment. For the apparatus according to the invention, however, it is unnecessary to retract any portion of the alignment optical system 20, for example, the objective lenses 21L, 21R and the plane parallel plates 22L, 22R, to a position outside the light path of the exposure illumination optical system 10. Even after the alignment, the alignment optical system 20 is allowed to stand in the same position as that for alignment.

Subsequently to the alignment step, an exposure step is carried out to print a pattern on the wafer from the reticle through the projection objective lens 1. To this end, a first wavelength light is emitted from a light source (not shown) of the exposure illumination optical system 20. The first wavelength light is transmitted to the dichroic mirror 30 through the main condenser 11.

Since the dichroic mirror 30 has the characteristic curve as previously shown, the incident first wavelength light is almost 100% reflected toward the reticle 2 by the mirror 30. Thus, the pattern on the reticle is transcribed on the wafer 3 through the projection objective lens 1.

The above procedure of alignment and exposure is repeated a number of times on the wafer. Since there is no need of retracting any part of the alignment optical system 20 between the alignment step and the exposure step, an improved working efficiency can be attained with the apparatus according to the invention.

In the above-shown embodiment, in order to increase the detectability of alignment, it is preferable to use a laser as the second wavelength light. However, theoretically the second wavelength light may be light from any ordinary light source.

As a modification of the above embodiment, the objective lenses 21L, 21R and plane parallel plates 22L, 22R of the alignment optical system 20 may be mounted for movement in the direction normal to the optical axis of the projection lens 1. In this modification, the alignment mark in any position can be observed through the alignment optical system.

While the alignment optical system 20 has been shown to have two sets of objective lenses and plane parallel plate (21L, 21R and 22L, 22R), it is to be understood that the number of the sets is not limited to two.

It is also to be understood that the incident angle of the optical axis of the exposure illumination optical system 10 to the dichroic mirror 30 is not limited to 45° but may be another angle. For example, the optical system may be arranged in such manner as to form a smaller incident angle to the dichroic mirror thereby reducing the difference between the dichroic mirror's characteristics to the polarized component in S-direction and to the polarized component in P-direction. In this case also, the plane parallel plates 22L and 22R are arranged symmetrically to the dichroic mirror regarding the plane normal to the optical axis.

Figure 3:
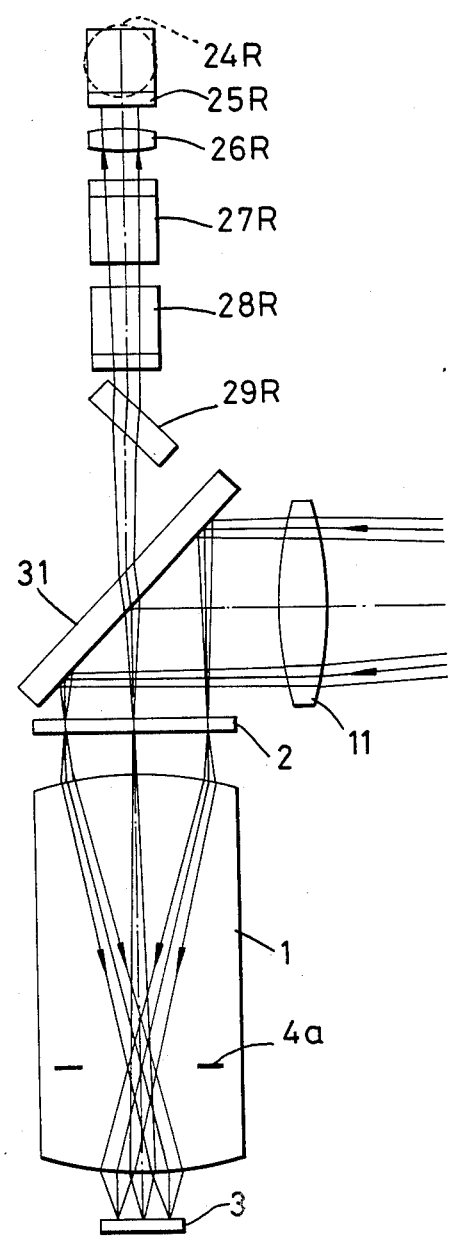
FIG. 3 is a schematic side view of an optical system showing a second embodiment of the present invention.

Although not shown in FIG. 2, the first embodiment includes an illumination optical system for alignment. The alignment illumination optical system will be described hereinafter with reference to FIGS. 3 and 4.

In the alignment illumination optical system, right and left light sources 40L and 40R generate laser beams having a wavelength different from the wavelength of the exposure light.

Figure 4:
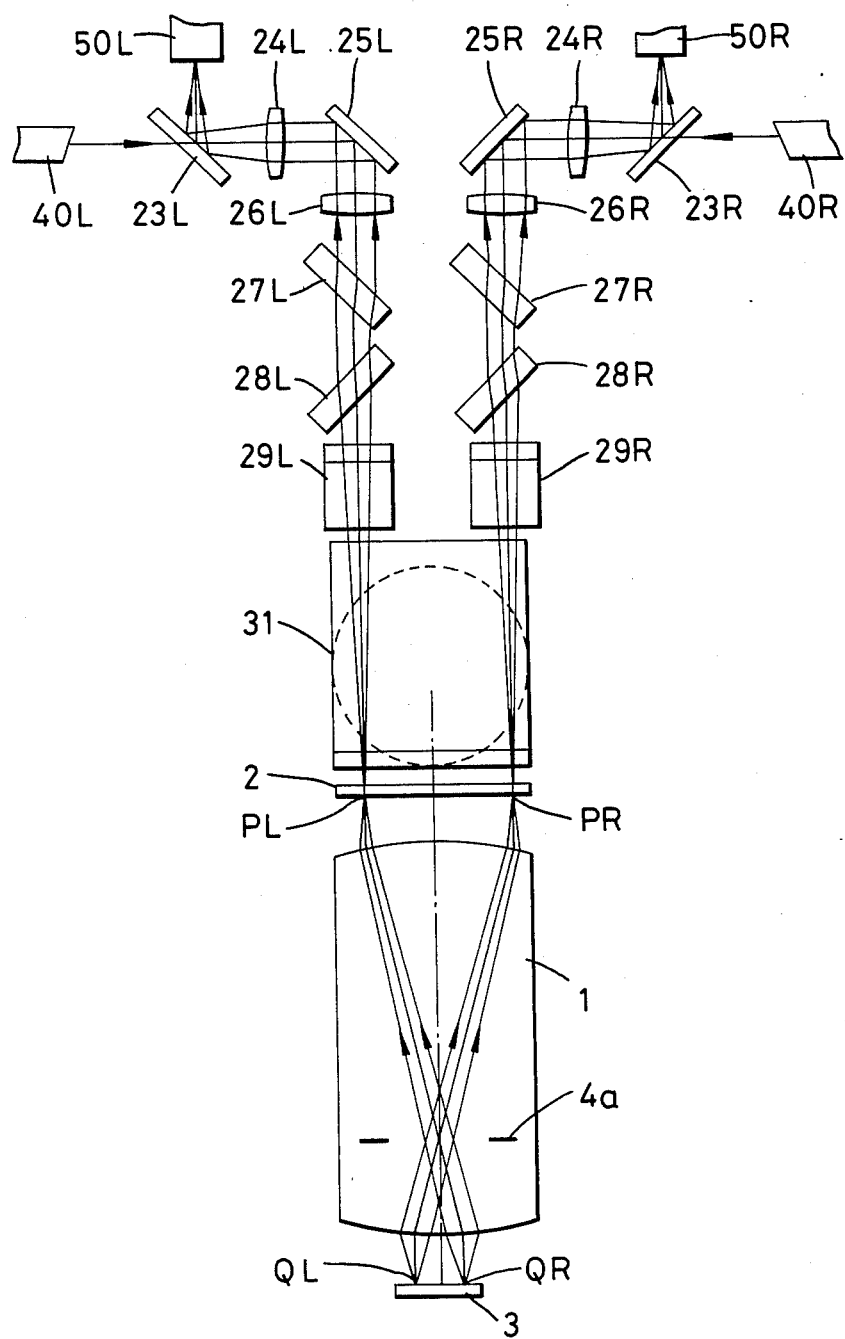
FIG. 4 is a front view thereof.

As seen best in FIG. 4, the laser beams enter a dichroic mirror 31 passing through half-mirrors 23L, 23R, second objective lenses for alignment 24L, 24R, reflecting mirrors 25L, 25R, first objective lenses for alignment 26L, 26R and aberration-correcting plates 27L, 27R, 28L, 28R and 29L, 29R. The structure and function of the dichroic mirror 31 will be described in detail later.

The laser beams transmitted through the dichroic mirror 31 illuminate left and right alignment marks $P_L$ and $P_R$ respectively. After illuminating the alignment marks $P_R$ and $P_L$, the alignment illumination beams pass through the center of a virtual aperture 4a of the aberration-corrected projection lens 1. Through the lens 1, the beams fall on alignment marks $Q_R$ and $Q_L$ formed on the wafer 3 and illuminate the marks. The aperture 4a is located at the rear focal point of the projection lens 1.

The laser beams which illuminate the alignment marks $Q_R$ and $Q_L$ on the wafer 3 are reflected by the marks and travel along the above optical path in the reverse direction. The reflected beams form, on the reticle 2, images of the wafer alignment marks $Q_R$ and $Q_L$. Thus, the image of the wafer alignment mark $Q_R$ and the alignment mark $P_L$ on the reticle 2 overlap each other. Similarly, the alignment marks $Q_L$ and $P_R$ overlap each other. These overlapped images of the alignment marks $P_L$, $P_R$ and $Q_R$, $Q_L$ are focused on the photo sensor surfaces of ITV image pickup tubes (or image pickup devices) 50L, 50R through the dichroic mirror 31, aberration-correcting plates 29L, 29R, 28L, 28R, 27L, 27R, first alignment objective lenses 26L, 26R, reflecting mirrors 25L, 25R, second alignment objective lenses 24L, 24R and half-mirrors 23L, 23R.

When light is transmitted through a plane parallel plate having a substantial thickness, a problem may occur. If the transmitted light is a parallel beam, the beam is subjected only to a lateral shift, which does not produce any problem of aberration. On the contrary, if the transmitted light is convergent or divergent light, aberrations are generated, in particular astigmatism and coma. This is applied also to the above alignment light beams toward the first alignment objective lenses 29L, 29R from the reticle 2 through the dichroic mirror 31. When the beams pass through the dichroic mirror, coma and astigmatism are produced. The function of the aberration-correcting plates is to correct these aberrations. The plates 29L, 29R are disposed 90° inclined to the dichroic mirror 31 and formed to correct the coma. The paired plates 28L, 27L and 28R, 27R are disposed 90° rotated about the alignment optical axis relative to the dichroic mirror 31 and inclined to the alignment optical axis by the same angle but in opposite directions to each other, and they are formed to correct the astigmatism.

When the numerical aperture (NA) of the alignment beam is small or when the thickness of the dichroic mirror 31 is sufficiently small so as not to produce aberrations, no aberration-correcting plates are needed. However, when the value of NA is large, the aberration-correcting plates 27L, 28L; 27R, 28R are very important to correct the astigmatism caused by the dichroic mirror 31. Although not shown, in a known alignment method, a cylindrical lens is used to shape a laser beam into a slit-like beam intersecting the optical axis and alignment marks are scanned by the slit beam. For this alignment method, it is essential to provide the aberration-correcting plates 29L, 29R to correct the coma caused by the dichroic mirror 31.

Figure 5:
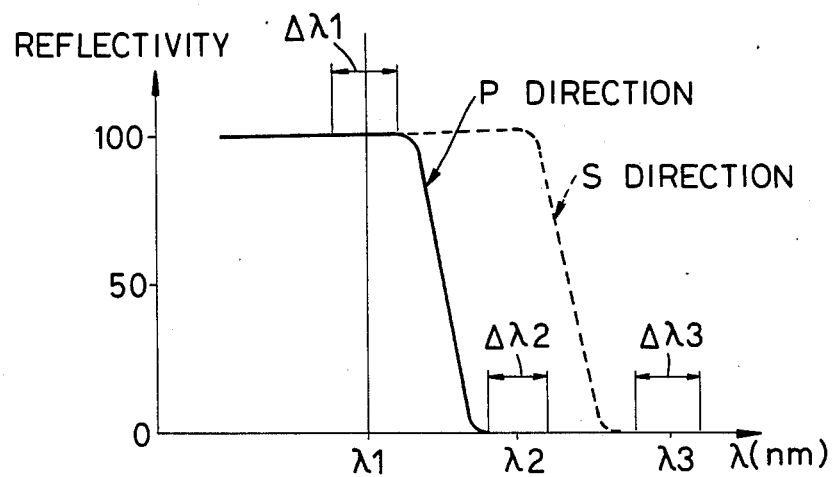
FIG. 5 is an optical characteristic curve of a dichroic mirror used in the second embodiment.

FIG. 5 shows the optical characteristics of the dichroic mirror 31 used in the embodiment shown in FIG.

3. As will be understood, the thin film of the dichroic mirror 31 is so designed to satisfy the following conditions:

The light of wavelength $\lambda_1$ is almost 100% reflected; as for the light of wavelength $\lambda_2$, the polarized component in P-direction oscillating in the plane normal to the mirror surface is nearly 100% transmitted and the polarized component in S-direction oscillating in the plane normal to the above is about 100% reflected.

Further, the light of longer wavelength $\lambda_3$ than the region where about 100% of S-polarized component is transmitted, is transmitted approximately 100%. The beam of a determined numerical aperture (NA) to the projection lens 1 on the reticle side should be uniformly reflected by or transmitted through the dichroic mirror 31.

Also, the light having a wavelength shifted from $\lambda_3$ by $\Delta\lambda_3 = \pm 3$ nm is about 100% transmitted.

Figure 6:
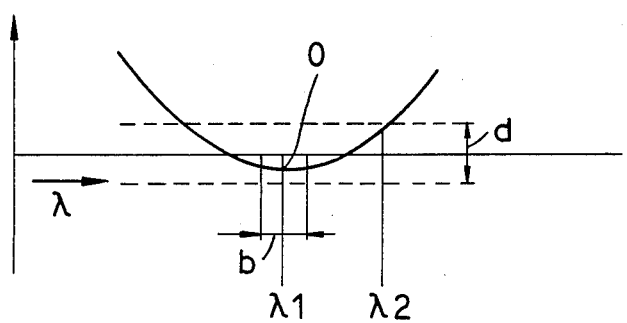

FIGS. 6 to 8 show various states of correction of aberration. Wavelength $\lambda$ is on the abscissa and magnitude of chromatic aberration on axis is on the ordinate. The area d between two broken lines shows the chromatic aberration allowable range.

The curve of FIG. 6 shows the state of aberration correction for a conventional projection lens. The chromatic aberration on axis describes a quadratic curve with an extremal value. In the chromatic aberration allowable area d there are contained the exposure wavelength $\lambda_1$ having a relatively wide half-width (spectrum width) b and the alignment wavelength of laser light $\lambda_2$. For the purpose of this specification, this type of projection lens is referred to as "collectively achromatic type".

In many prior art exposure apparatus, a projection lens made of ordinary glass has been used as the projection lens 1. This projection lens has a relatively narrow chromatic aberration allowable range. Therefore, the exposure wavelength $\lambda_1$ and the alignment wavelength $\lambda_2$ are near to each other and the lens belongs to the type shown in FIG. 6. When this collectively achromatic type of projection lens 1 is used together with the dichroic mirror 30 according to the invention, the combinations of exposure wavelength $\lambda_1$ and alignment wavelength $\lambda_2$ shown in the following Table 2 are preferably used.

TABLE 2

(Collectively achromatic type)

| EXPOSURE WAVELENGTH ($\lambda_1$) | ALIGNMENT WAVELENGTH ($\lambda_2$) | |
|---|---|---|
| Hg lamp 436 ± 2 nm | He-Cd laser | 442 nm |
| Hg lamp 365 ± 2 nm | Kr laser etc. | |
| Hg lamp 313 ± 2 nm | He-cd laser | 325 nm |
| Xe Cl excimer laser 308 ± 0.5 nm | He-Cd laser | 325 nm |
| KrF excimer laser 249 ± 0.5 nm | YAG laser (4/ times higher) | 266 nm |
| | Ar laser (2/ times higher) | 257 nm |

Hg lamp (high voltage mercury lamp) spectra 436 nm, 365 nm and 313 nm are selected as the representative examples of the exposure wavelength $\lambda_1$. Since their half-width is relatively wide, the same value ±2 nm is set for all of them. Excimer laser light is another example of the exposure wavelength. The relatively wide half-width of XeCl and KrF is considered to be ±0.5 nm.

It is preferable to select a high illuminance light source for the alignment light; He—Cd: 442 nm, He—Cd: 325 nm and the like are selected as the examples of a laser which can be used easily. As the alignment wavelength $\lambda_2$ is near the exposure wavelength $\lambda_1$, the area of the dichroic mirror 31 to be used is, as shown by $\lambda_2$ in FIG. 5, the area in which P-polarized component is transmitted and S-polarized component is reflected.

The curve of chromatic aberration on axis of the projection lens in FIG. 7 is also a quadratic curve with an extremal value maximum like the curve of FIG. 6. The lens is corrected for chromatic aberration to the wavelength $\lambda_1$ on the shorter wavelength side of the extremal value 0 and to the wavelength $\lambda_3$ on the longer side. In this specification, this type of projection lens is referred to as "narrow-band dichromatically achromatic type".

When this type of projection lens is used, it is to be noted that the exposure wavelength $\lambda_1$ is far away from the extremal value 0 toward the shorter wavelength side and the chromatic aberration allowable range $d_1$ is narrow. Therefore, in this case, an excimer laser having a narrow half-width is used as the light source for exposure. For the alignment wavelength $\lambda_3$, various light sources may be selected according to the design of the projection lens 1.

The following Table 3 shows examples of the suitable combination of exposure wavelength $\lambda_1$ and alignment wavelength $\lambda_3$ used through the dichroic mirror 31 for the above-mentioned type of chromatic aberration-corrected projection lens.

TABLE 3

(Narrow-band dichromatically achromatic type)

| EXPOSURE WAVELENGTH ($\lambda_1$) | ALIGNMENT WAVELENGTH ($\lambda_3$) | |
|---|---|---|
| Xe Cl excimer laser 308 ± 0.005 nm | He-Ne laser | 633 nm |
| Xe Cl excimer laser 308 ± 0.005 nm | Ar laser | 488 nm |
| Xe Cl excimer laser 308 ± 0.005 nm | He-Cd laser | 442 nm |
| Xe Cl excimer laser 308 ± 0.005 nm | He-Cd laser | 325 nm |
| KrF excimer laser 249 ± 0.005 nm | He-Ne laser | 633 nm |
| KrF excimer laser 249 ± 0.005 nm | Ar laser | 488 nm |
| KrF excimer laser 249 ± 0.005 nm | He-Cd laser | 442 nm |
| KrF excimer laser 249 ± 0.005 nm | He-Cd laser | 325 nm |

Examples of excimer laser light shown in Table 3 all have a small half-width as that of injection locking type. Since the alignment wavelength $\lambda_3$ is far apart from the exposure wavelength $\lambda_1$, the alignment wavelength $\lambda_3$ is used in the total transmission area of the dichroic mirror 31 (the area of $\lambda_3$ in FIG. 5).

The first-mentioned collectively achromatic type of projection lens has a disadvantage that only the wavelength near the exposure wavelength can be used as the alignment wavelength. The second-mentioned narrow band dichromatically achromatic type of projection lens needs a laser light of narrow wavelength width for both of exposure and alignment. It is impossible to use a plurality of alignment wavelengths.

However, if one corrects the chromatic aberration by using, in the ingredients of the projection lens 1, an optical material which exhibits extraordinary dispersion such as fluorite ($CaF_2$), lithium fluoride (LiF), there is obtained a projection lens having a chromatic aberration curve as shown in FIG. 8.

The curve of chromatic aberration on axis as a function of wavelength is a cubic curve having at least two extremal values $0_1$ and $0_2$.

By setting the abscissa X at a level nearly contacting with the extremal value $0_1$ on the shorter wavelength side of the curve shown in FIG. 8, one can correct the chromatic aberration on axis up to 0 (zero) for wavelength $\lambda_1$ (wavelength substantially equal to the extremal value $0_1$) and for wavelength $\lambda_3$ in the longer wavelength area further than the extremal point $0_2$. In this case, at the area near the extremal value $0_1$, wide wavelength width can be obtained within the chromatic aberration allowable range. Therefore, in this case, in addition to an excimer laser, other light sources having a wide spectral width such as a Hg lamp (super high voltage mercury lamp) can be used. In this specification, this third type of projection lens is referred to as "wide-band dichromatically achromatic type". This third type of projection lens has an advantage that the wavelength $\lambda_2$ a little longer than $\lambda_1$ can be used not only for exposure but also for alignment. The wavelength $\lambda_3$ in the longer wavelength region further than the extremal value $0_2$ is used as the alignment light.

Tables 4 and 5 show examples of suitable combination of exposure wavelength $\lambda_1$ and alignment wavelengths $\lambda_2$ and $\lambda_3$ used through the dichroic mirror 31 for the wide-band dichromatically achromatic type of projection lens 1.

TABLE 4

(Wide-band dichromatically achromatic type, I)

| EXPOSURE WAVELENGTH ($\lambda_1$) | ALIGNMENT WAVELENGTH ($\lambda_2$) | ALIGNMENT WAVELENGTH ($\lambda_3$) | |
|---|---|---|---|
| Hg lamp 436 ± 2 nm | — | He-Ne laser | 633 nm |
|  | — | Ar laser | 488 nm |
| Hg lamp 365 ± 2 nm | — | He-Ne laser | 633 nm |
|  | — | Ar laser | 488 nm |
|  | — | He-Cd laser | 442 nm |
| Hg lamp 313 ± 2 nm | — | He-Ne laser | 633 nm |
|  | — | Ar laser | 488 nm |
|  | — | He Cd laser | 442 nm |
| Xe Cl excimer laser 308 ± 0.5 nm | — | He-Ne laser | 633 nm |
|  | — | Ar laser | 488 nm |
|  | — | He-Cd laser | 442 nm |
| KrF excimer laser 249 ± 0.5 nm | — | He-Ne laser | 633 nm |
|  | — | Ar laser | 488 nm |
|  | — | He-Cd laser | 442 nm |

As shown in the above table, as the exposure wavelength $\lambda_1$, Hg lamp spectra 436 nm, 365 nm, 313 nm and the like can be used with the spectral width of ±2 nm. Further, a XeCl excimer laser and a KrF excimer laser can be used at wavelength 308±0.5 nm and at wavelength 249±0.5 nm respectively. As the alignment light, there can be used only the wavelength $\lambda_3$ in the area further than the extremal point $0_2$ on the longer wavelength side in FIG. 8. It is used at the total transmission area of the dichroic mirror 31 (the polarized component in S-direction is also at the total transmission area) in FIG. 5.

When the wide-band dichromatically achromatic type of projection lens is used, it is possible to select two wavelengths as the alignment wavelength as shown in Table 5. In this case, as shown by $\lambda_2$ and $\lambda_3$ in FIG. 5, the dichroic mirror 31 is so formed that of the alignment wavelength $\lambda_2$ near the exposure wavelength $\lambda_1$ P-component is transmitted and S-component is reflected and that the alignment wavelength $\lambda_3$ far from the exposure wavelength $\lambda_1$ is totally-transmitted.

TABLE 5

(Wide-band dichromatically achromatic type, II)

| EXPOSURE WAVELENGTH ($\lambda_1$) | ALIGNMENT WAVELENGTH ($\lambda_2$) | | ALIGNMENT WAVELENGTH ($\lambda_3$) | |
|---|---|---|---|---|
| Hg lamp 436 ± 2 nm | He-Cd laser | 442 nm | He-Ne laser | 633 nm |
|  | He-Cd laser | 442 nm | Ar laser | 488 nm |
| Hg lamp 313 ± 2 nm | He-Cd laser | 325 nm | He-Ne laser | 633 nm |
|  | He-Cd laser | 325 nm | Ar laser | 488 nm |
|  | He-Cd laser | 325 nm | He-Cd laser | 442 nm |
| Xe Cl excimer laser 308 ± 0.5 nm | He-Cd laser | 325 nm | He-Ne laser | 633 nm |
|  | He-Cd laser | 325 nm | Ar laser | 488 nm |
|  | He-Cd laser | 325 nm | He-Cd laser | 442 nm |

When the wafer to be aligned is a wafer coated with resist (sensitizer), there sometimes happens that, under a certain condition of interference by the thickness of refractive index of the resist coating, no detection signal can be obtained from the alignment mark on the wafer by the alignment wavelength then used or the detection signal, if obtained, contains much noise. In many cases, this kind of trouble can be overcome by using two different wavelengths for alignment. Even if satisfactory mark detection signal can not be obtained by one of the two wavelengths, a satisfactory detection signal may be obtained by the other wavelength. Therefore, one can expect an improvement in mark detection by using two different wavelengths for alignment.

Although not shown in Table 5, in the case of FIG. 8, it is also possible to use two different wavelengths (for example, $\lambda_1$ and $\lambda_2$) for exposure while using one wavelength (for example $\lambda_3$) for alignment. When the exposure is carried out by using an exposure wavelength, there may be generated a standing wave at the pattern edge on the wafer by the reflected light from both of the resist surface and the wafer surface. The standing wave may prevent the formation of a fine pattern image. The use of two different wavelengths (for example $\lambda_1$ and $\lambda_2$) for exposure has an effect to reduce the generation of such standing wave. Therefore, an improvement in the control of the width of printed lines may be expected.

While the dichroic mirrors 30 and 31 in the above embodiments have been formed on a plane parallel plate, it is to be understood that the dichroic mirror may be formed also by cementing two rectangular prisms together with the oblique side surface being a reflecting surface. The transmission light through the prisms generates no aberration. Therefore, this modified dichroic mirror has an advantage that the aberration-correcting plates 22R, 27R, 28R, 29R and 22L, 27L 28L, 29L are dispensable.

In view of the advantage in manufacture it is advisable to use a cold mirror type of dichroic mirror which reflects short wavelength and transmits long wavelength. Generally an alignment optical system which has a high detection ability with less noise is obtained by using a high illuminance laser as the alignment light beam. However, many of the stable lasers have wavelengths longer than the exposure wavelength. Because of this, in the embodiment shown in FIG. 3 there has been used the dichroic mirror 31 which reflects the exposure wavelength and transmits the alignment wavelength. But, it is to be understood that according to the combination of alignment wavelength and exposure alignment there may be used a dichroic mirror which transmits the exposure wavelength and reflects the alignment wavelength.

Obviously many changes and modifications are possible in the light of the above teachings.

We claim:

1. Apparatus for holding a wafer and a reticle having a pattern formed thereon, exposing said wafer to first light and carrying out alignment between reticle and wafer by second light having a wavelength different from that of the first light, said apparatus comprising:
   (a) an illumination optical system for illuminating the pattern on said reticle by the first light;
   (b) an alignment optical system for detecting the state of the alignment between reticle and wafer by the second light;
   (c) a projection optical system for projecting an image of the illuminated reticle pattern onto the wafer, said projection optical system being disposed on the opposite side to said illumination optical system relative to the reticle in such a manner that the optical axes of the projection optical system and the alignment optical system are in parallel to each other and being so formed as to correct the chromatic aberration on axis to the wavelengths of said first light and said second light;
   (d) an optical member disposed between the alignment optical system and the projection optical system for reflecting the first light and transmitting the second light, said optical member intersecting the optical axis of the alignment optical system and the optical axis of the illumination optical system; and
   (e) optical correction means for correcting aberrations generated by said optical member with respect to the second light transmitted through the alignment optical system, said optical correction means including a first correction plane parallel plate for correcting coma and second and third correction plane parallel plates for correcting astigmatism.

2. Apparatus according to claim 1, wherein the projection optical system is constructed so that it has an optical characteristic in which chromatic aberration as a function of wavelength has at least two extremal values.

3. Apparatus according to claim 2, wherein said optical member comprises a dichroic mirror.

4. Apparatus according to claim 3, wherein said dichroic mirror and said first, second and third correction plane parallel plates are arranged in the optical path along which the second light is converged by said alignment optical system.

5. Apparatus according to claim 4, wherein said dichroic mirror of said optical member is disposed in such manner as to form a determined angle with a plane normal to the optical axis of said projection optical system; and said first correction plane parallel plate is between the optical member and the alignment optical system and wherein said first correction plane parallel plate is so disposed as to form an angle two times larger than said determined angle with said dichroic mirror of said optical member.

6. Apparatus according to claim 5, wherein said second and third correction plane parallel plates are between said first correction plane parallel plate and said alignment optical system in such manner that they form the same angle with a plane normal to the optical axis of said projection optical system, and planes normal to said second and third correction plane parallel plates are orthogonal to the dichroic mirror of said optical member and a plane normal to the first correction plane parallel plate.

7. Apparatus for holding a wafer and a reticle having a pattern formed thereon, exposing said wafer to first light and carrying out alignment between reticle and wafer by second light having a wavelength different from that of the first light, said apparatus comprising:
   (a) an illumination optical system for illuminating the pattern on said reticle by the first light;
   (b) a projection optical system for projecting an image of the illuminated reticle pattern onto the wafer, said projection optical system being disposed on the opposite side to said illumination optical system relative to the reticle;
   (c) an alignment optical system for detecting the state of the alignment between the reticle and the wafer by the second light; and
   (d) an optical member disposed between the illumination optical system and the projection optical system for reflecting one of the first light and second light and transmitting the other, said alignment optical system being disposed on the opposite side to the reticle relative to said optical member;
   and wherein the projection optical system comprises means for providing an optical characteristic in said projection optical system in which chromatic aberration as a function of wavelength has at least two extremal values.

8. Apparatus according to claim 7, wherein said optical member is a plane parallel plate having a reflective film formed thereon which reflects the first light and transmits the second light.

9. Apparatus according to claim 9, which further comprises optical correction means for correcting the aberrations of the second light generated by said optical member.

10. Apparatus for holding a wafer and a reticle having a pattern formed thereon, exposing said wafer to first light and carrying out alignment between reticle and wafer by second light having a wavelength different from that of the first light, said apparatus comprising:
   (a) an illumination optical system for illuminating the pattern on said reticle by the first light;
   (b) a projection optical system for projecting an image of the illuminated reticle pattern onto the wafer, said projection optical system being disposed on the opposite side to said illumination optical system relative to the reticle;
   (c) an alignment optical system for detecting the state of the alignment between the reticle and the wafer by the second light;
   (d) an optical member disposed between the illumination optical system and the projection optical system for reflecting one of the first light and second light and transmitting the other, said alignment optical system being disposed on the opposite side to the reticle relative to said optical member, said optical member being a plane parallel plate having a reflective film formed thereon which reflects the first light and transmits the second light; and
   (e) optical correction means for correcting the aberrations of the second light generated by said optical member;

and wherein the plane parallel plate of said optical member is disposed in such manner as to form a determined angle with a plane normal to the optical axis of said projection optical system; and said optical correction means includes a first connection plane parallel plate between the optical member and the alignment optical system and wherein said first correction plane parallel plate is so disposed as to form an angle two times larger than said determined angle with the plane parallel plate of said optical member.

11. Apparatus according to claim 19, wherein second and third correction plane parallel plates are disposed between said first correction plane parallel plate and said alignment optical system in such manner that they form the same angle with a plane normal to the optical axis of said projection optical system, and planes normal to said second and third correction plane parallel plates are orthogonal to the plane parallel plate of said optical member and a plane normal to the first correction plane parallel plate.

12. Apparatus according to claim 11, wherein said optical member and said first, second and third correction plane parallel plates are arranged in an optical path along which the second light is converged by said alignment optical system.

13. Apparatus for holding a wafer and a reticle having a pattern formed thereon, exposing said wafer to first light and carrying out alignment between reticle and wafer by second light having a wavelength different from that of the first light, said apparatus comprising:
   (a) an illumination optical system for illuminating the pattern on said reticle by the first light;
   (b) a projection optical system for projecting an image of the illuminated reticle pattern onto the wafer, said projection optical system being disposed on the opposite side to said illumination optical system relative to the reticle;
   (c) an alignment optical system for detecting the state of the alignment between the reticle and the wafer by the second light;
   (d) an optical member disposed between the illumination optical system and the projection optical system for reflecting one of the first light and second light and transmitting the other, said alignment optical system being disposed on the opposite side to the reticle relative to said optical member; and
   (e) optical correction means for correcting the aberrations of the second light generated by said optical member;
   and wherein said optical correction means comprises a first plane parallel plate for correcting coma generated by said optical member and second and third plane parallel plates for correcting astigmatism generated by said optical member.

14. Apparatus according to claim 7, wherein said projection optical system is constructed so that it has an optical characteristic in which chromatic aberration as a function of wavelength becomes substantially zero at one of at least two extremal values.

15. Apparatus according to claim 15, in which said characteristic has only two extremal values and in which the extremal value at shorter wavelength is substantially zero.

16. Apparatus according to claim 16, wherein the wavelength at the extremal value of substantially zero is substantially equal to the wavelength of said first light.

17. Apparatus according to claim 17, wherein the wavelength of said second light is longer than the wavelength of said first light.

18. Apparatus according to claim 17, wherein the chromatic aberration at the wavelength of said second light is also substantially zero, and wherein the wavelength of said second light is longer than wavelengths corresponding to said two extremal values.

19. Apparatus according to claim 7, wherein said projection optical system is constructed so that it has an optical characteristic in which chromatic aberration as a function of wavelength becomes substantially zero at one of only two extremal values, the wavelength of said first light being substantially coincident with the wavelength at the extremal value of substantially zero.

* * * * *